United States Patent
Chui

(10) Patent No.: US 9,831,589 B2
(45) Date of Patent: Nov. 28, 2017

(54) COMPRESSIBLE PIN ASSEMBLY HAVING FRICTIONLESSLY CONNECTED CONTACT ELEMENTS

(71) Applicant: Corad Technology Inc., Santa Clara, CA (US)

(72) Inventor: Ka Ng Chui, Menlo Park, CA (US)

(73) Assignee: Corad Technology Inc., Santa Clara, CA (US)

( * ) Notice: Subject to any disclaimer, the term of this patent is extended or adjusted under 35 U.S.C. 154(b) by 0 days.

(21) Appl. No.: 15/391,672

(22) Filed: Dec. 27, 2016

(65) Prior Publication Data

US 2017/0110820 A1    Apr. 20, 2017

Related U.S. Application Data

(63) Continuation-in-part of application No. 14/216,103, filed on Mar. 17, 2014, now Pat. No. 9,570,828, which is a continuation-in-part of application No. 13/644,125, filed on Oct. 3, 2012, now abandoned.

(51) Int. Cl.
*H01R 12/00*    (2006.01)
*H01R 13/24*    (2006.01)

(52) U.S. Cl.
CPC ................................ *H01R 13/2421* (2013.01)

(58) Field of Classification Search
CPC ................ H01R 23/722; H01R 23/725; H01R 13/2421; H05K 7/1084; G03B 17/02
USPC ...................... 439/66, 70, 74, 515, 700, 824
See application file for complete search history.

(56) References Cited

U.S. PATENT DOCUMENTS

| | | | |
|---|---|---|---|
| 4,743,201 A | 5/1988 | Robinson et al. | |
| 5,061,192 A | 10/1991 | Chapin | |
| 5,142,101 A * | 8/1992 | Matsuzaki | H05K 9/0015 174/354 |
| 5,163,834 A * | 11/1992 | Chapin | H01R 13/2435 439/591 |
| 5,321,224 A * | 6/1994 | Kamimura | B23K 9/04 219/137 R |
| 5,385,477 A | 1/1995 | Vaynkof et al. | |

(Continued)

OTHER PUBLICATIONS

Non-Final Office Action dated Jan. 3, 2014 issued in related co-pending U.S. Appl. No. 13/644,125, filed Oct. 3, 2012, Ka Ng Chui.

(Continued)

*Primary Examiner* — Thanh Tam Le
(74) *Attorney, Agent, or Firm* — Paradice and Li LLP

(57) ABSTRACT

A compressible contact pin. The contact pin includes a first contact element and a second contact element. A compressible member is coupled between the first contact element and the second contact element to compress when one or more external forces are applied between the first contact element and the second contact element. In addition, the compressible member maintains a separation distance between the first and second contact elements when no external forces are applied. A plurality of conductive particles is bounded by the compressible member to form an electrical connection between the first contact element and the second contact element. The conductive particles are configured to compress with one another when the compressible member is compressed.

14 Claims, 13 Drawing Sheets

(56) References Cited

U.S. PATENT DOCUMENTS

| | | | |
|---|---|---|---|
| 5,427,535 A * | 6/1995 | Sinclair | H01R 13/2414 439/66 |
| 5,624,277 A * | 4/1997 | Ward | H01R 13/7195 439/620.09 |
| 6,033,233 A * | 3/2000 | Haseyama | G01R 1/06716 439/515 |
| 6,264,476 B1 | 7/2001 | Li et al. | |
| 6,406,226 B2 | 6/2002 | Biernath | |
| 6,541,698 B2 * | 4/2003 | Miska | H05K 9/0015 174/358 |
| 6,712,260 B1 | 3/2004 | Li et al. | |
| 6,773,312 B2 | 8/2004 | Bauer | |
| 6,921,299 B2 | 7/2005 | McMaster | |
| 6,939,143 B2 * | 9/2005 | Rathburn | H01L 23/49811 257/E23.067 |
| 6,958,616 B1 | 10/2005 | Mahoney | |
| 7,308,738 B2 | 12/2007 | Barvosa-Carter | |
| 7,371,073 B2 * | 5/2008 | Williams | H01R 13/2407 439/66 |
| 7,377,822 B1 | 5/2008 | Shen | |
| 7,549,870 B2 * | 6/2009 | Mason | H01R 9/096 439/66 |
| 7,549,871 B2 * | 6/2009 | Pennypacker | H01R 12/714 439/66 |
| 7,666,000 B1 | 2/2010 | Hsiao et al. | |
| 7,833,020 B1 | 11/2010 | Ma et al. | |
| 8,029,291 B2 | 10/2011 | Park | |
| 8,084,927 B2 | 12/2011 | Xiao | |
| 8,102,184 B2 * | 1/2012 | Sherry | G01R 1/06716 324/754.03 |
| 8,118,604 B2 | 2/2012 | Ma | |
| 8,659,312 B2 | 2/2014 | Nakata | |
| 8,952,258 B2 * | 2/2015 | Plucinski | H01R 12/55 174/250 |

OTHER PUBLICATIONS

Final Office Action dated Mar. 20, 2014 issued in related co-pending U.S. Appl. No. 13/644,125, filed Oct. 3, 2012, Ka Ng Chui.
Non-Final Office Action dated Jul. 3, 2014 issued in related co-pending U.S. Appl. No. 13/644,125, filed Oct. 3, 2012, Ka Ng Chui.
Non-Final Office Action dated Oct. 20, 2015 issued in related co-pending U.S. Appl. No. 14/216,103, filed Mar. 17, 2014, Ka Ng Chui.
Final Office Action dated Feb. 19, 2016 issued in related co-pending U.S. Appl. No. 14/216,103, filed Mar. 17, 2014, Ka Ng Chui.
Non-Final Office Action dated Jul. 14, 2016 issued in related co-pending U.S. Appl. No. 14/216,103, filed Mar. 17, 2014, Ka Ng Chui.
Notice of Allowance dated Oct. 21, 2016 issued in related co-pending U.S. Appl. No. 14/216,103, filed Mar. 17, 2014, Ka Ng Chui.

* cited by examiner

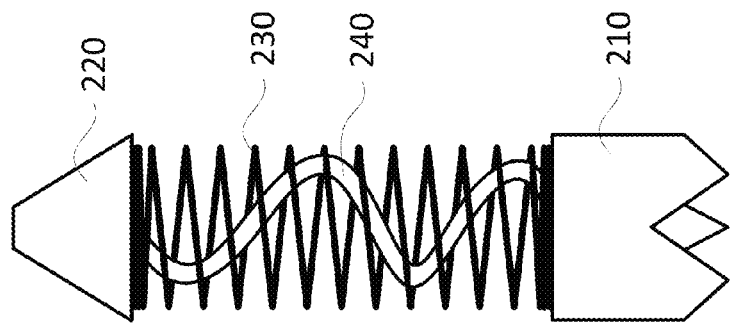
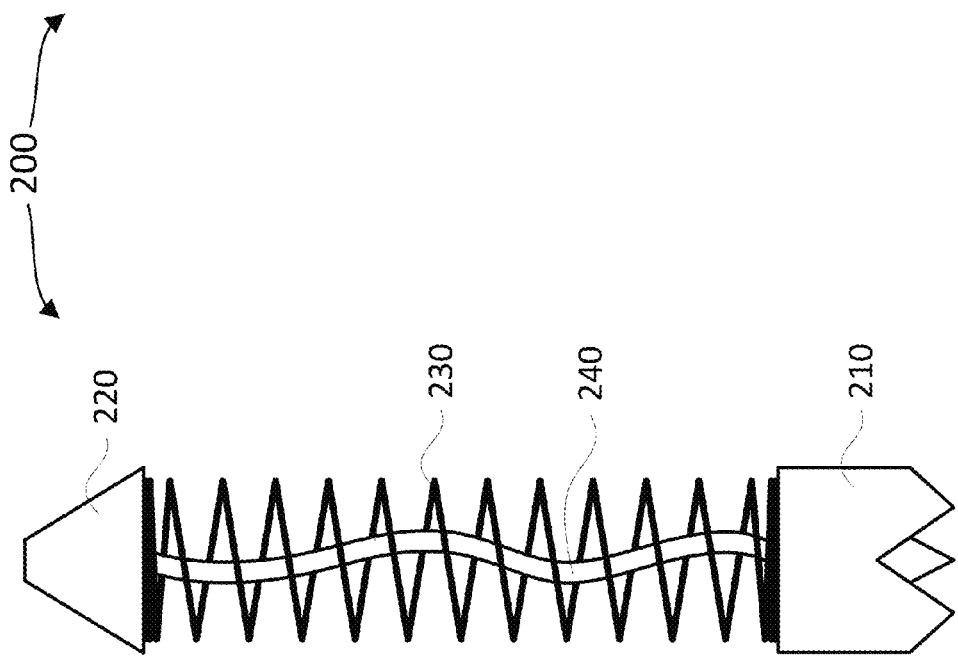

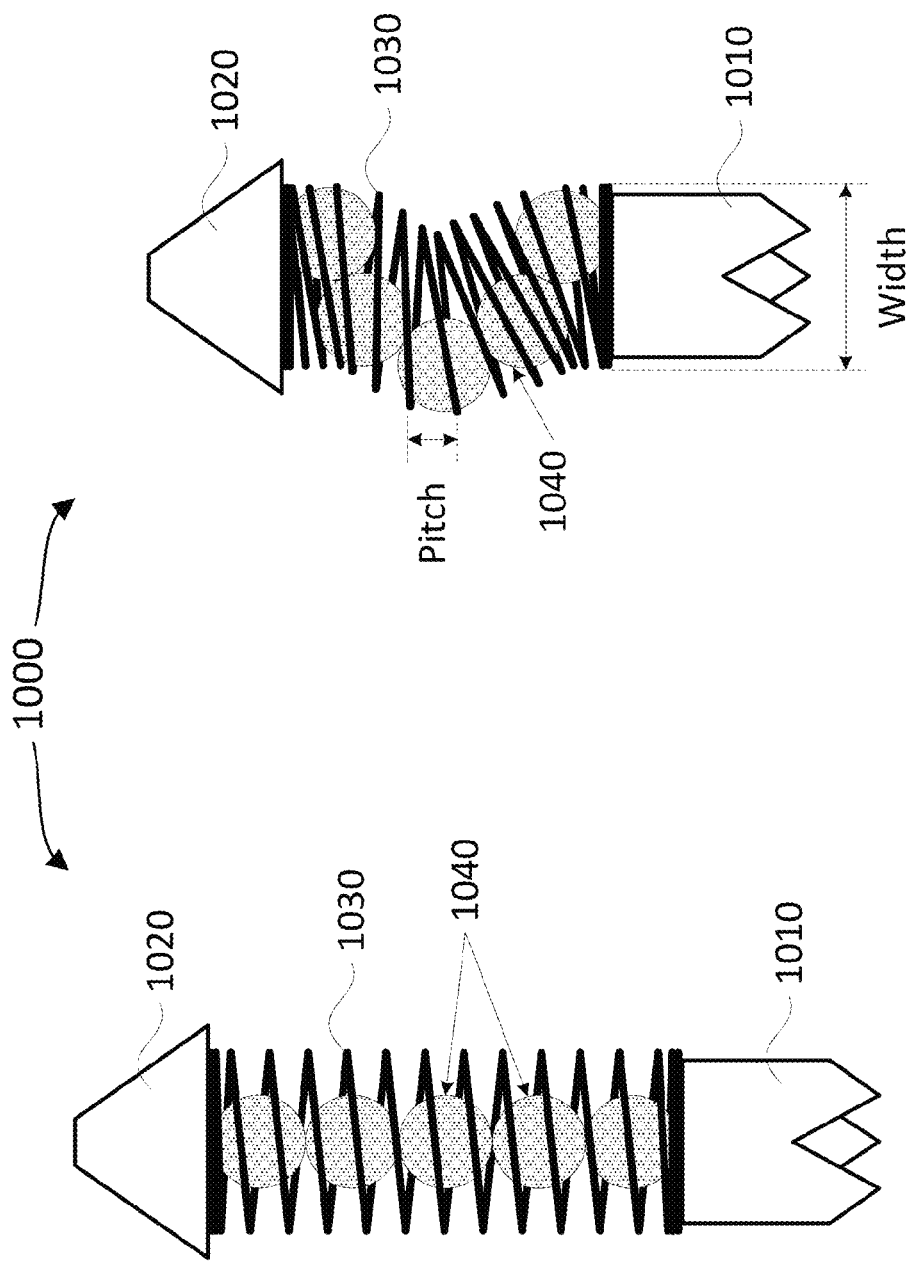

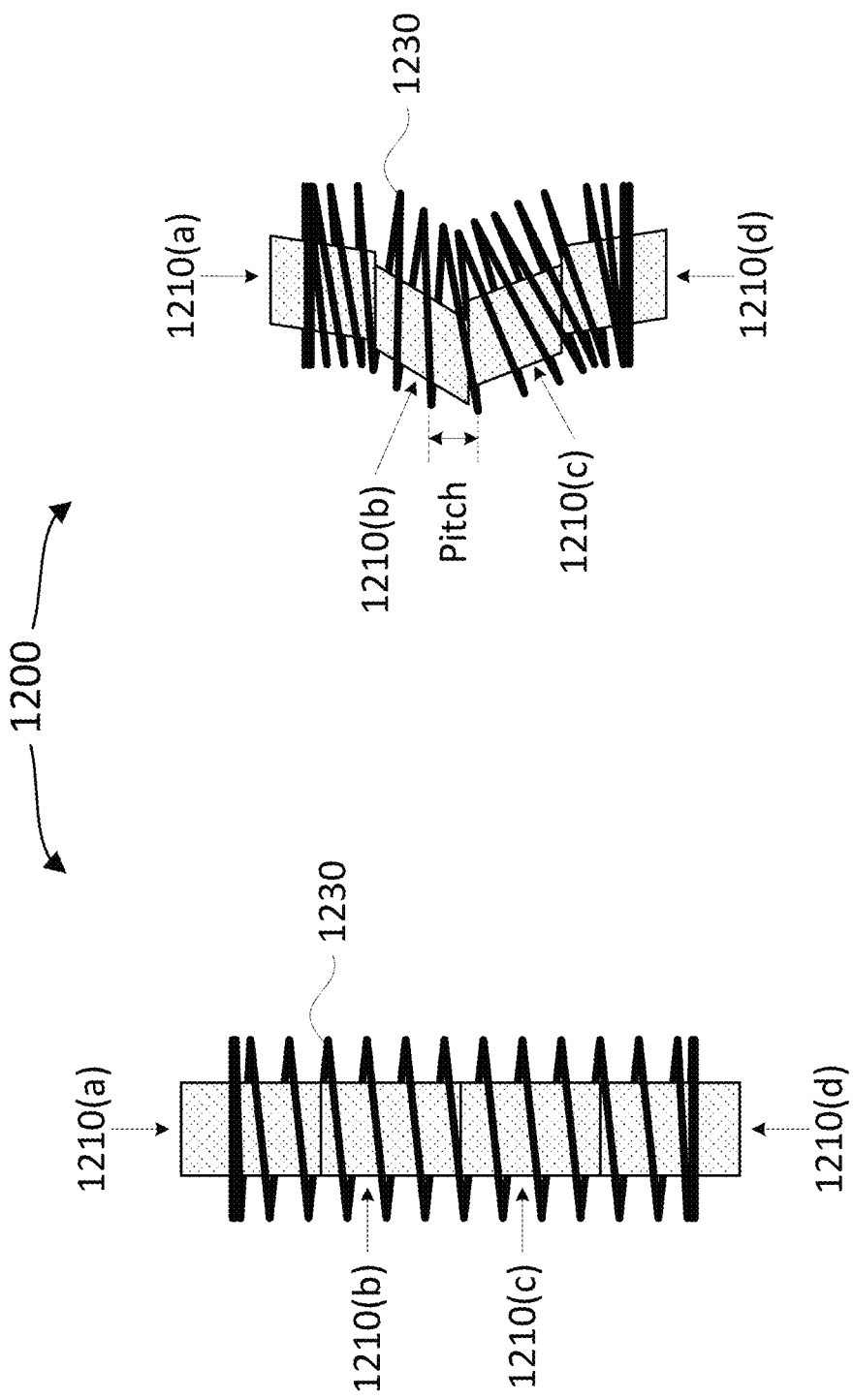

COMPRESSIBLE PIN ASSEMBLY HAVING FRICTIONLESSLY CONNECTED CONTACT ELEMENTS

RELATED APPLICATIONS

This application is a continuation-in-part of U.S. patent application Ser. No. 14/216,103, entitled "COMPRESSIBLE PIN ASSEMBLY HAVING FRICTIONLESSLY CONNECTED CONTACT ELEMENTS," filed on Mar. 17, 2014, which is a continuation-in-part of U.S. patent application Ser. No. 13/644,125, entitled "COMPRESSIBLE PIN ASSEMBLY HAVING FRICTIONLESSLY CONNECTED CONTACT ELEMENTS," filed on Oct. 3, 2012; the aforementioned priority applications being hereby incorporated by reference in their entireties.

TECHNICAL FIELD

The present invention relates generally to compressible contact pins used in the testing of electronic devices, and specifically to a compressible pin assembly having frictionlessly connected contact elements.

BACKGROUND OF RELATED ART

Pogo pins are often used in the testing of integrated circuit (IC) devices. IC packages typically have a number of contact pads, which serve as an interface or connection point to external circuitry. These contact pads are very small and delicate. Thus, a testing apparatus, used to test the function or performance of an IC device, must be able to make contact with one or more contact pads on the IC device without damaging the pads. Otherwise, the device may be rendered unusable for its intended purpose. The design and compressibility of pogo pins allow them to make contact with an IC device or a contact pad on the device.

FIG. 1 illustrates a prior art embodiment of a typical pogo pin. The pogo pin 100 is made up of two contact elements 110 and 120, held together by a spring 130 and a housing 140. The first contact element 110 is designed to make a secure contact with a contact pad of an IC device. The second contact element 120 can be connected to circuitry on a testing apparatus. The first and second contact elements 110 and 120 are electrically coupled together via the housing 140 to bridge a connection between the ends of the pogo pin 100 so that electrical signals can be transmitted between the testing apparatus and the IC device.

When the pogo pin 100 is sandwiched between an IC device and a testing apparatus, the spring 130 compresses to exert force on the contact pad of the IC device by the first contact element 110. However, in order to maintain an electrical connection between the IC device and the testing apparatus, the first and second contact elements 110 and 120 must remain in constant contact with the housing 140, regardless of the amount of compression or displacement caused by the force of contact with the underlying IC device. Accordingly, the first and second contact elements 110 and 120 must rub against the inner wall of the housing 140, creating contact resistance, as the pogo pin 100 is compressed and decompressed. The friction between the first and second contact elements 110 and 120 and the housing 140 causes wear and tear on the surfaces 150 where each of the first and second contact elements 110 and 120 makes contact with the housing 140. This, in turn, increases the contact resistance. Such wear and tear, along with the increased contact resistance, can reduce the signal quality transmitted by the pogo pin 100 over time.

Accordingly, there is a need for a compressible contact pin that can withstand continued use without loss of signal quality. More specifically, there is a need for a compressible contact pin comprised of frictionlessly connected contact elements, so that the contact pin can be compressed and decompressed without substantial wear and tear on its parts and/or increased contact resistance.

BRIEF DESCRIPTION OF THE DRAWINGS

The present embodiments are illustrated by way of example and not intended to be limited by the figures of the accompanying drawings.

FIGS. 2A and 2B illustrate an embodiment of a compressible contact pin having frictionlessly connected contact elements.

FIGS. 10A and 10B illustrate an embodiment of a compressible contact pin including a number of conductive particles to provide electrical coupling.

FIGS. 12A and 12B illustrate another embodiment of a compressible contact pin including a number of conductive particles to provide electrical coupling.

Like reference numerals refer to corresponding parts throughout the drawing figures.

DETAILED DESCRIPTION

Figure 1:
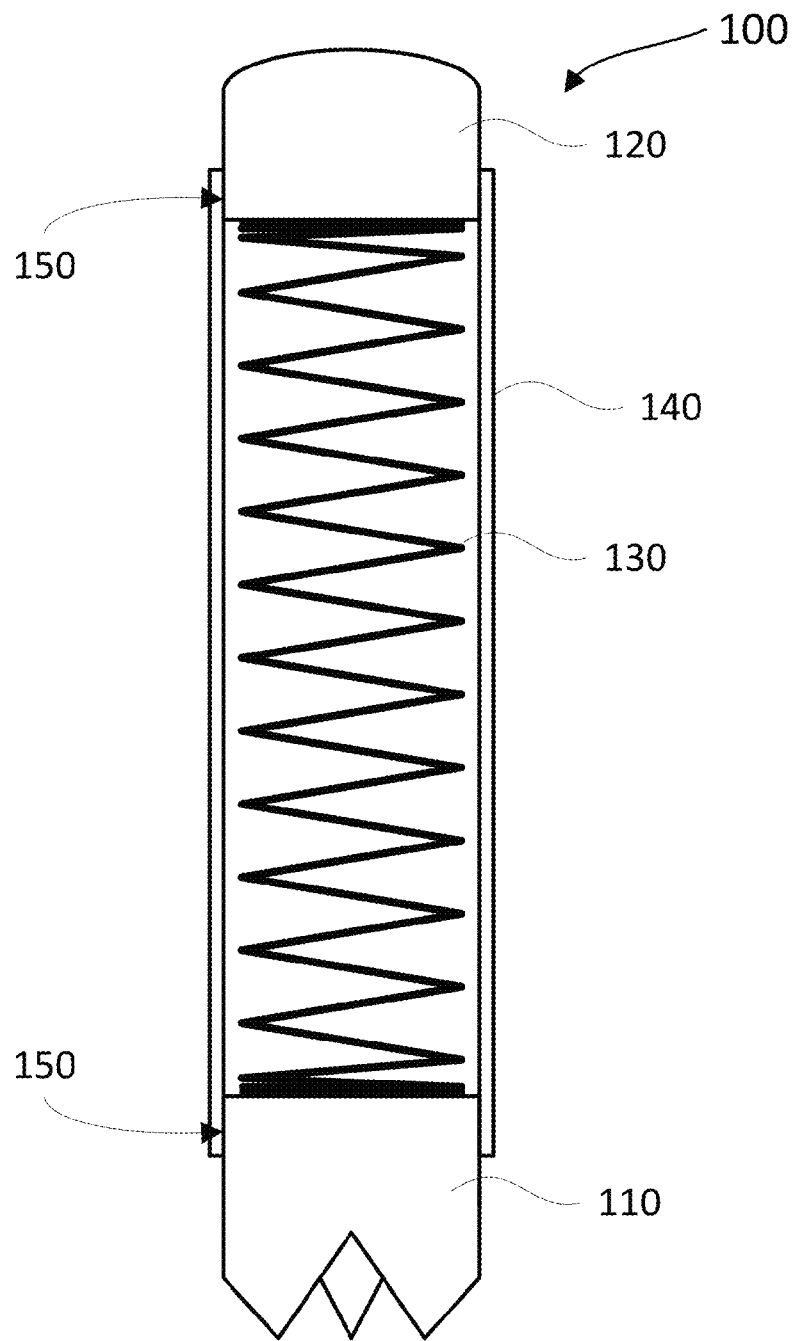
FIG. 1 illustrates a prior art embodiment of a pogo pin.

A compressible contact pin having frictionlessly connected contact elements is disclosed. In the following description, for purposes of explanation, specific nomenclature is set forth to provide a thorough understanding of the present invention. However, it will be apparent to one skilled in the art that these specific details may not be required to practice the present invention. In some instances, the interconnection between circuit elements may be shown as buses or as single signal lines. Each of the buses may alternatively be a single signal line, and each of the single signal lines may alternatively be a bus. As used herein, references to "frictionless" or "frictionlessly" may refer to an absence of surface-to-surface contact or rubbing when two or more components are moveably coupled to one another. Furthermore, the terms "contact pad" and "contact bump" may be used herein interchangeably. Accordingly, the present invention is not to be construed as limited to specific examples described herein but rather includes within its scope all embodiments defined by the appended claims.

Present embodiments provide a compressible contact pin having little or no contact force on the moving parts along its signal path. The contact elements of the compressible contact pin are frictionlessly coupled together so that the surfaces of the contact elements do not rub against (e.g., wear out) any other surfaces of the compressible contact pin as the pin is compressed and decompressed. In specific embodiments, a compressible contact pin includes two contact elements electrically coupled via a number of conductive particles that are configured to rotate or shift when the contact pin is compressed and decompressed. Other embodiments provide for a contact pin assembly, wherein a compressible contact pin is disposed in a housing that provides structural support for the contact pin and limits an amount of lateral movement by the conductive particles when external forces are exerted on the contact elements.

FIGS. 2A and 2B illustrate an embodiment of a compressible contact pin having frictionlessly connected contact elements. The compressible contact pin 200 includes a first contact element 210, a second contact element 220, a compressible member 230, and a deformable conductor 240. In some embodiments, the shape or geometry of the first contact element 210 is designed to allow the first contact element 210 to make contact with a contact pad (or contact "bump") of an IC device. Similarly, the shape of the second contact element 220 may be designed to allow the second contact element 220 to make contact with the circuitry of a testing apparatus.

The compressible member 230 maintains a separation distance between the first and second contact elements 210 and 220, thus extending the "reach" of the contact pin 200 when the contact pin 200 is in a "natural" or uncompressed state. In addition, the compressible member 230 absorbs some of the force exerted by one or more of the contact elements 210 and 220 when making contact with an IC device or testing apparatus. For example, when the first contact element 210 is brought into contact with a contact pad of an IC device or package, the compressible member 230 compresses to allow an inward travel of the first contact element 210, as shown in FIG. 2B. This causes the first contact element 210 to exert a force on the contact pad of an underlying IC device in order to form a robust contact and/or connection with the contact pad. When the first contact element 210 is no longer pressed against the contact pad of an IC device, the compressible member 230 reverts back to its natural, uncompressed state.

The deformable conductor 240 electrically couples the first contact element 210 with the second contact element 220 to facilitate a flow of electrical signals (or current) between the first and second contact elements 210 and 220. As shown in FIG. 2B, the deformable conductor 240 "deforms" (e.g., flexes or bends) when the contact pin 200 is compressed. This allows the first contact element 210 to remain electrically coupled to the second contact element 220 regardless of the degree of compression of the contact pin 200. Moreover, compression of the contact pin 200 does not create any friction among the contact elements 210 and 220 or deformable conductor 240 because no surfaces of the first and second contact element 210 and 220, or deformable conductor 240, rub against any other surfaces of the compressible contact pin 200.

In some embodiments, the compressible member 230 may be a spring or spring-like structure that compresses under external forces or pressure, but naturally reverts to an uncompressed state when no external force is applied. Furthermore, the compressible member 230 may be formed from (or coated with) a non-conductive material that does not interfere with a flow of electrical signals between the first and second contact elements 210 and 220. In other embodiments, the compressible member 230 simply has a higher electrical impedance than that of the deformable conductor 240 to ensure that electrical signals communicated between the first and second contact elements 210 and 220 travel only along the deformable conductor 240. The compressible member 230 may be attached to the first and second contact elements 210 and 220 using any number of processes that are well known in the art. For example, each of the contact elements 210 and 220 may be attached to a different end of the compressible member 230 using an adhesive material (e.g., glue). Alternatively, the ends of the compressible member 230 may be welded or soldered to each of the first and second contact elements 210 and 220.

In some embodiments, the deformable conductor 240 may be structurally configured to deform when an external force is applied. Alternatively, the deformable conductor 240 may be of a conductive material that naturally deforms when compressed, such as a copper wire. The deformable conductor 240 may be separately attached to the first and second contact elements 210 and 220 using any number of processes that are well known in the art. For example, the ends of the deformable conductor 240 may be welded or soldered to the first and second contact elements 210 and 220, respectively (e.g., using laser welding and/or soldering techniques).

The frictionless coupling of the first and second contact elements 210 and 220 is advantageous because it reduces the wear and tear along the signal path of the compressible contact pin 200, thus preserving the signal integrity of electrical signals transmitted via the contact pin 200 after repeated uses. This, in turn, prolongs the usable life of the compressible contact pin 200.

Figure 3:
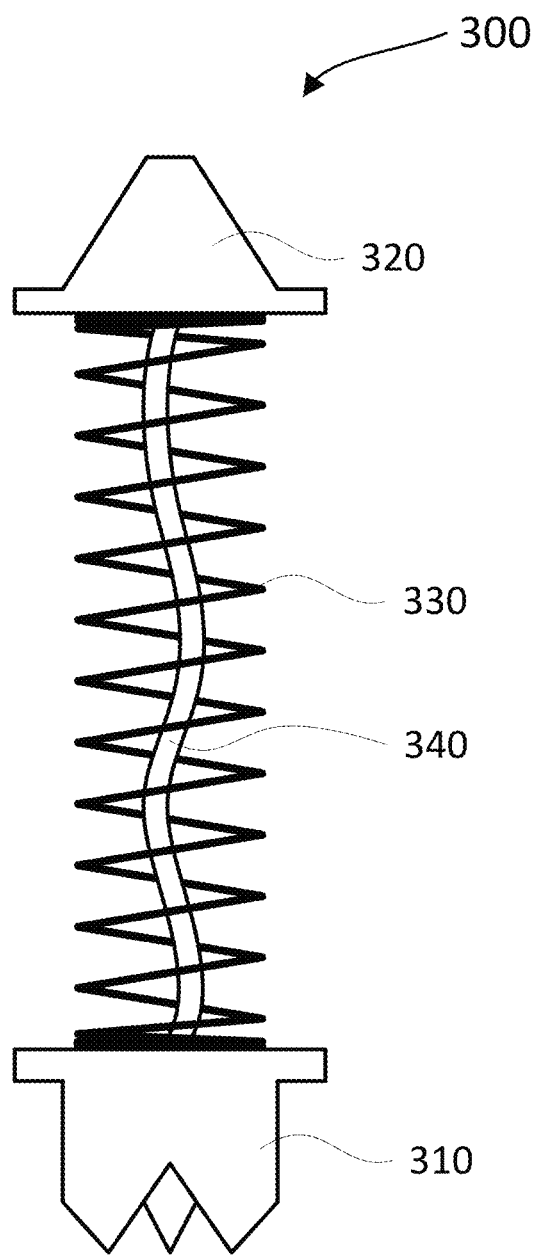
FIG. 3 illustrates another embodiment of a compressible contact pin having frictionlessly connected contact elements.

FIG. 3 illustrates another embodiment of a compressible contact pin having frictionlessly connected contact elements. The compressible contact pin 300 includes a first contact element 310, a second contact element 320, a compressible member 330, and a deformable conductor 340. The first and second contact elements 310 and 320 are mechanically coupled via the compressible member 330, which maintains a distance of separation between the first and second contact elements 310 and 320 when the contact pin 300 is in an uncompressed state. The deformable conductor 340 electrically couples the first contact element 310 with the second contact element 320 to facilitate a flow of electrical signals between the first and second contact elements 310 and 320.

The shape of the first contact element 310 may be designed to allow the first contact element 310 to make contact with a contact pad of an IC device. In an embodiment, the base of the first contact element 310 (e.g., where the deformable conductor 340 attaches) has an extended lip that may be used to hold the contact pin 300 within a housing or support structure, as will be discussed in greater detail with respect to FIGS. 4A and 4B. In addition, the extended lip may reduce the overall wear and tear on the first contact element 310 as it moves within the housing. The shape of the second contact element 320 may be designed to allow the second contact element 320 to make contact with the circuitry of a testing apparatus. According to an embodiment, the base of the second contact element 320 also has an extended lip that may be used to hold the contact pin 300 within a housing and/or reduce wear and tear while moving within the housing.

Figure 4A:
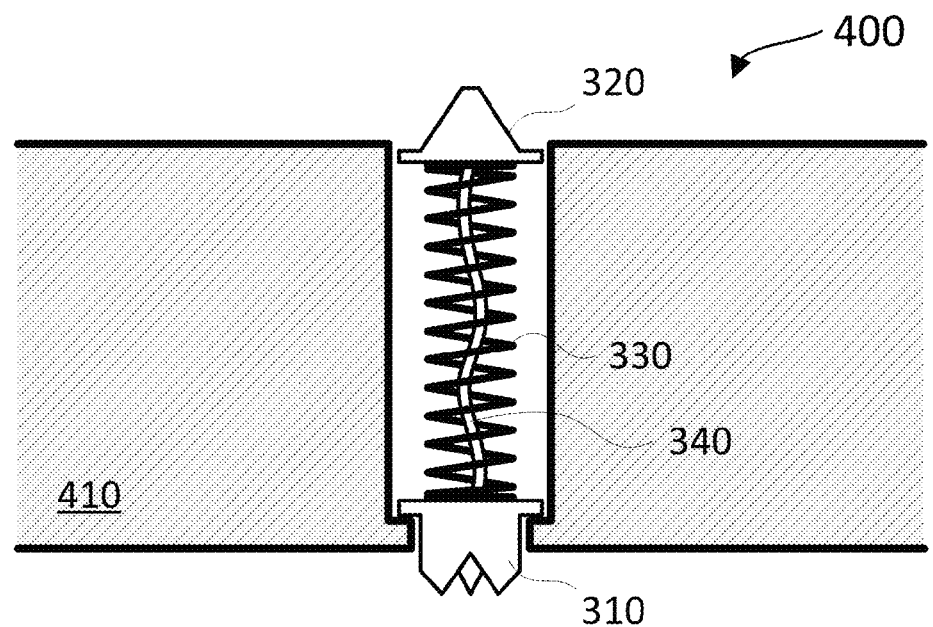
FIGS. 4A and 4B illustrate an embodiment of a compressible contact pin assembly.

FIG. 4A illustrates an embodiment of a compressible contact pin assembly. The contact pin assembly 400 includes a first contact element 310, a second contact element 320, a compressible member 330, a deformable conductor 340, and a housing 410. The first and second contact elements 310 and 320, compressible member 330, and deformable conductor 340 collectively form the compressible contact pin 300 shown in FIG. 3. The housing 410 holds the contact pin 300 in place when interfacing a testing apparatus with an IC device. For example, the bottom surface of the housing 410 may have a opening that is not wide enough for the base of the first contact element 310 to fit through. In addition, the housing 410 provides structural support for the compressible contact pin 300 by guiding the movement or displacement of the first and second contact elements 310 and 320.

Figure 4B:
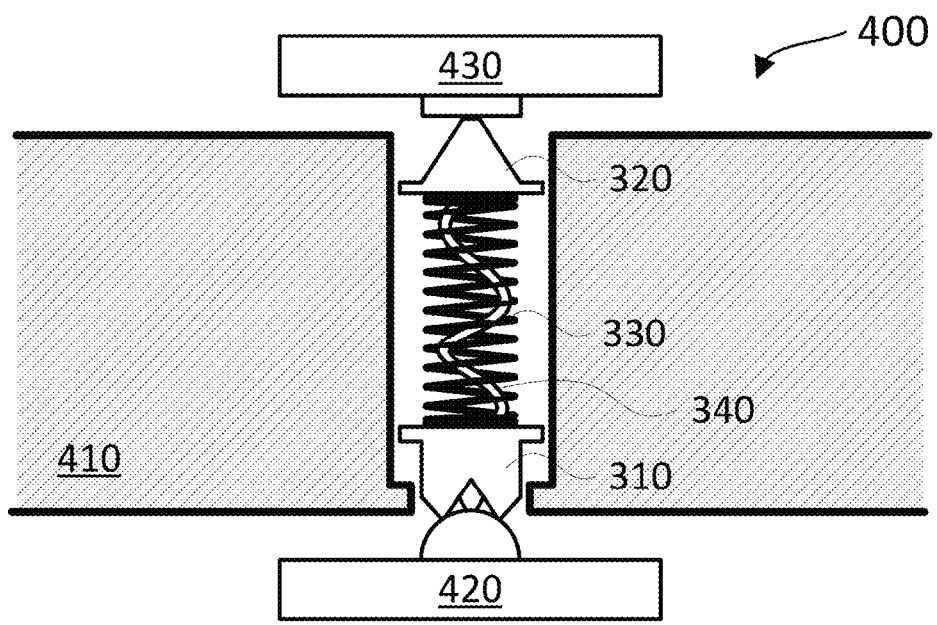

FIG. 4B shows the contact pin assembly of FIG. 4A with the compressible contact pin 300 in a compressed state. As shown in FIG. 4B, the second contact element 320 makes contact with a testing apparatus 430, and the first contact element 310 is brought into contact with a contact bump of an IC device 420. This causes the compressible member 330 to compress, thus causing the first contact element 310 to exert a force on the contact bump of the IC device 420. The deformable conductor 340 also deforms (e.g., flexes or bends) when the compressible member 330 compresses. Accordingly, the deformable conductor 340 maintains an electrical connection between the first contact element 310 and the second contact element 320 without causing any surfaces of the first and second contact elements 310 and 320, or deformable conductor 340, to rub against any other surfaces of the compressible contact pin 300. The deformable conductor 340 thus facilitates the transmission of electrical signals between the testing apparatus 430 and the IC device 420 without substantial wear or tear.

In some embodiments, the compressible member 330 may be a spring or spring-like structure that compresses under external forces or pressure, but naturally reverts to an uncompressed state when no external force is applied. Furthermore, the compressible member 330 may be formed from a non-conductive material. Alternatively, the compressible member 330 may have a higher electrical impedance than that of the deformable conductor 340. The compressible member 330 may be attached to the first and second contact elements 310 and 320 using any number of processes that are well known in the art. For example, each of the contact elements 310 and 320 may be attached to a different end of the compressible member 330 using an adhesive material (e.g., glue). Alternatively, the ends of the compressible member 330 may be welded or soldered to the first and second contact elements 310 and 320.

In some embodiments, the deformable conductor 340 may be structurally configured to deform when an external force is applied. Alternatively, the deformable conductor 340 may be of a conductive material that naturally deforms when compressed, such as copper wire. The deformable conductor 340 may be separately attached to the first and second contact elements 310 and 320 using any number of processes that are well known in the art. For example, the ends of the deformable conductor 340 may be welded or soldered to the first and second contact elements 310 and 320.

In some embodiments, the housing 410 may be formed from a non-conductive/dielectric material. Furthermore, the housing 410 may be configured to hold multiple compressible contact pins similar to the compressible contact pin 300 shown in FIG. 3. For example, the contact pin assembly 400 may correspond to the probe head associated with a probe card.

The frictionless coupling of the first and second contact elements 310 and 320 is advantageous because it reduces the wear and tear along the signal path of the compressible contact pin 300, thus preserving the signal integrity of electrical signals transmitted via the contact pin 300 after repeated uses. In addition, the housing 410 maintains the structural rigidity of the contact pin assembly 400 while also restricting lateral movement and/or displacement of the first and second contact elements 310 and 320 when making contact with the IC device and testing apparatus, respectively.

Figure 5A:
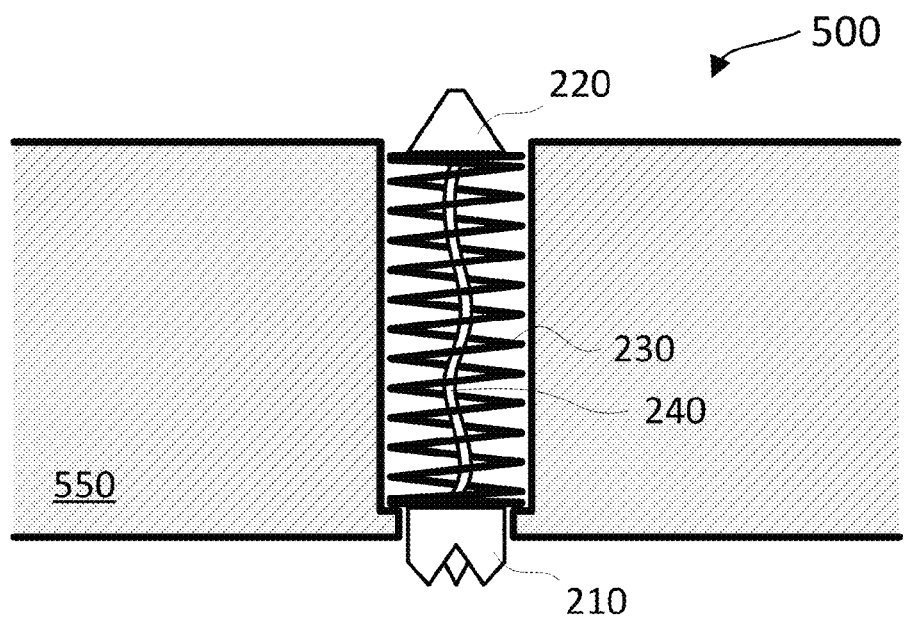
FIGS. 5A and 5B illustrate another embodiment of a compressible contact pin assembly.

FIG. 5A illustrates another embodiment of a compressible contact pin assembly. The contact pin assembly 500 includes a first contact element 210, a second contact element 220, a compressible member 230, a deformable conductor 240, and a housing 550. The first and second contact elements 210 and 220, compressible member 230, and deformable conductor 240 collectively form the compressible contact pin 200 described above with respect to FIGS. 2A and 2B. However, in this embodiment, the compressible member 230 has a wider diameter relative to the diameter of the contact elements 210 and 220. The housing 550 holds the contact pin 200 in place when interfacing a testing apparatus with an IC device. For example, the bottom surface of the housing 550 may have a opening that is not wide enough for the compressible member 230 to fit through. In addition, the housing 550 provides structural support for the compressible contact pin 200 by guiding the movement or displacement of the first and second contact elements 210 and 220.

Figure 5B:
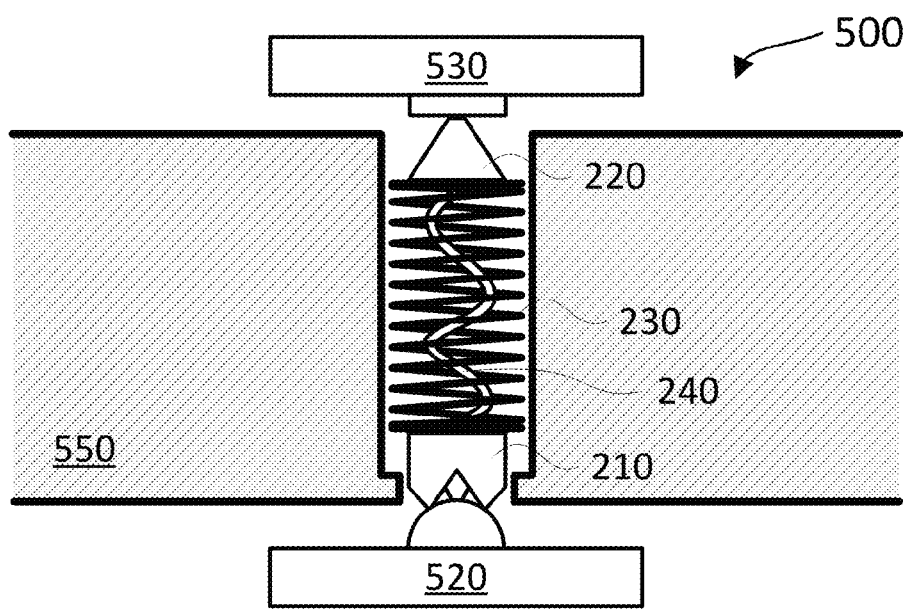

FIG. 5B shows the contact pin assembly of FIG. 5A with compressible contact pin 200 in a compressed state. As shown in FIG. 5B, the second contact element 220 makes contact with a testing apparatus 530, and the first contact element 210 is brought into contact with a contact bump of an IC device 520. This causes the compressible member 230 to compress, thus causing the first contact element 210 to exert a force on the contact bump of the IC device 520. The deformable conductor 240 also deforms (e.g., flexes or bends) when the compressible member 230 compresses. Accordingly, the deformable conductor 240 maintains an electrical connection between the first contact element 210 and the second contact element 220 without causing any surfaces of the first and second contact elements 210 and 220, or deformable conductor 240, to rub against any other surfaces of the compressible contact pin 200.

In some embodiments, the compressible member 230 may be a spring or spring-like structure that compresses under external forces or pressure, but naturally reverts to an uncompressed state when no external force is applied. Furthermore, the compressible member 230 may be formed from a non-conductive material. Alternatively, the compressible member 230 may have a higher electrical impedance than that of the deformable conductor 240. The compressible member 230 may be attached to the first and second contact elements 210 and 220 using any number of processes that are well known in the art. For example, each of the contact elements 210 and 220 may be attached to a different end of the compressible member 230 using an adhesive material. Alternatively, the ends of the compressible member 230 may be welded or soldered to the first and second contact elements 210 and 220.

In some embodiments, the deformable conductor 240 may be structurally configured to deform when an external force is applied. Alternatively, the deformable conductor 240 may be of a conductive material that naturally deforms when compressed, such as copper wire. The deformable conductor 240 may be separately attached to the first and second contact elements 210 and 220 using any number of processes that are well known in the art. For example, the ends of the deformable conductor 240 may be welded or soldered to the first and second contact elements 210 and 220. In some embodiments, the housing 550 may be formed from a non-conductive/dielectric material. Furthermore, the housing 550 may be configured to hold multiple compressible contact pins.

Figure 6:
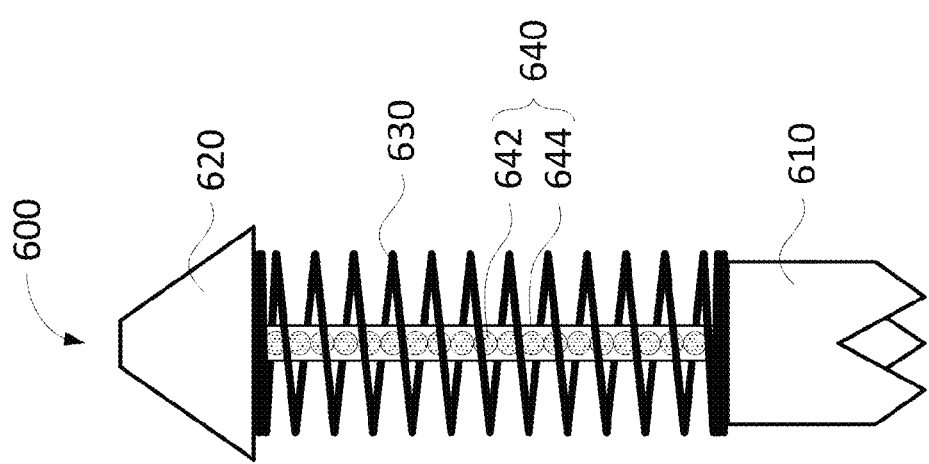

FIG. 6 illustrates an embodiment of a compressible contact pin 600 having an elastomeric connector. The compressible contact pin 600 includes a first contact element 610, a second contact element 620, a compressible member 630, and a deformable conductor 640. As described above, the shape or geometry of the first contact element 610 may be designed to allow the first contact element 610 to make contact with a contact pad or bump of an IC device. Further, the shape of the second contact element 620 may be designed to allow the second contact element 620 to make contact with the circuitry of a testing apparatus. For some embodiments, the base diameter of the second contact element 620 is wider than the diameter of the compressible member 630, and thus at least a portion of the second contact element 620 extends beyond the outer circumference of the compressible member 630 (e.g., to hold the contact pin 600 within a housing or support structure). Further, it should be noted that the base diameter of the first contact element 610 may be of equal or smaller size than the diameter of the compressible member 630.

The compressible member 630 maintains a separation distance between the first and second contact elements 610 and 620 when the contact pin 600 is in a natural or uncompressed state. When placed in contact with an IC device and/or testing apparatus, the compressible member 630 absorbs some of the force exerted on one or more of the contact elements 610 and 620. For some embodiments, the compressible member 630 may be a spring or spring-like structure that compresses under external forces or pressure, but naturally reverts to an uncompressed state when no external force is applied. Further, for some embodiments, the compressible member 630 may be formed from (or coated with) a non-conductive material that does not interfere with a flow of electrical signals between the first and second contact elements 610 and 620. In other embodiments, the compressible member 630 may have a higher electrical impedance than that of the deformable conductor 640 to ensure that electrical signals communicated between the first and second contact elements 610 and 620 travel only via the deformable conductor 640. The compressible member 630 may be attached to each of the contact elements 610 and 620 using an adhesive material (e.g., glue). Alternatively, the ends of the compressible member 630 may be welded or soldered to each of the first and second contact elements 610 and 620.

The deformable conductor 640 electrically couples the first contact element 610 with the second contact element 620 to facilitate a flow of electrical signals (or current) between the first and second contact elements 610 and 620. For some embodiments, the deformable conductor 640 is an elastomeric connector. The elastomeric connector includes column of conductive particles 642 (such as silver-plated nickel) disposed within an elastic (e.g., silicon) shield 644. The conductive particles 642 are in contact with one another to form a column of conductive material bridging the first contact element 610 with the second contact element 620. The elastic shield 644 "deforms" (e.g., stretches laterally) when the contact pin 600 is compressed, allowing the conductive particles 642 to press against and/or compress with one another and thus maintain an electrical connection between the first contact element 610 and the second contact element 620 while the pin 600 is under compression. It should be noted that, compression of the contact pin 600 does not create any friction among the contact elements 610 and 620 or deformable conductor 640 because no surfaces of the first and second contact element 610 and 620, or deformable conductor 640, rub against any other surfaces of the compressible contact pin 600.

The deformable conductor 640 may be attached to the first and second contact elements 610 and 620 using any number of processes that are well known in the art. For example, the ends of the elastic shield 644 may be attached to the first and second contact elements 610 and 620, respectively, using an adhesive material (e.g., glue). For some embodiments, the deformable conductor 640 may be held in place by forces exerted between the first and second contact elements 610 and 620. For example, the forces holding the deformable conductor 640 in place may be provided by the tension in the compressible member 630 (e.g., in the compressed and/or uncompressed state).

Figure 7:
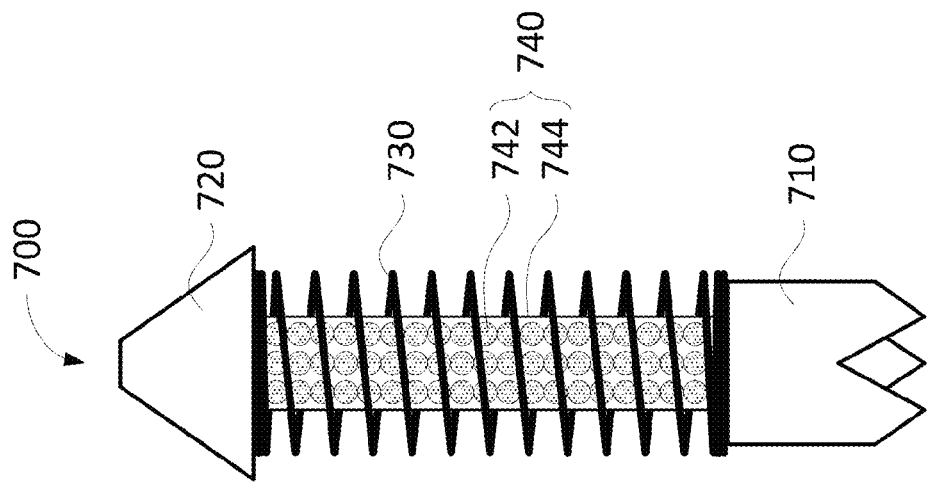
FIGS. 6-8 illustrate embodiments of a compressible contact pin having an elastomeric connector.

FIG. 7 illustrates another embodiment of a compressible contact pin 700 having an elastomeric connector. The compressible contact pin 700 includes a first contact element 710, a second contact element 720, a compressible member 730, and a deformable conductor 740. The first and second contact elements 710 and 720 may have the same or substantially similar features as the first and second contact elements 610 and 620, respectively, as described above with respect to FIG. 6. Furthermore, the compressible member 730 may perform the same or substantially similar function as the compressible member 630, also described above with respect to FIG. 6.

The deformable conductor 740 is an elastomeric connector that electrically couples the first contact element 710 with the second contact element 720. In contrast with the deformable conductor 640 of FIG. 6, which includes a single column of conductive particles 642, the deformable conductor 740 includes multiple columns of conductive particles 742 disposed within an elastic shield 744. The elastic shield 744 deforms when the contact pin 700 is compressed, allowing the conductive particles 742 in each column to press against and/or compress with one another. Accordingly, each column of conductive particles 742 maintains a corresponding electrical connection between the first contact element 710 and the second contact element 720 while the pin 700 is compressed. It should be noted that, by having multiple columns of conductive particles 742, multiple current paths are established between the first contact element 710 and the second contact element, thereby increasing the current-carrying capacity of the deformable conductor 740.

As described above, the deformable conductor 740 may be attached to the first and second contact elements 710 and 720 using any number of processes that are well known in the art. For example, the ends of the elastic shield 744 may be attached to the first and second contact elements 710 and 720, respectively, using an adhesive material. For some embodiments, the deformable conductor 740 may be held in place by forces exerted between the first and second contact elements 710 and 720. For example, the forces holding the deformable conductor 740 in place may be provided by the tension in the compressible member 730 (e.g., in the compressed and/or uncompressed state).

Figure 8:
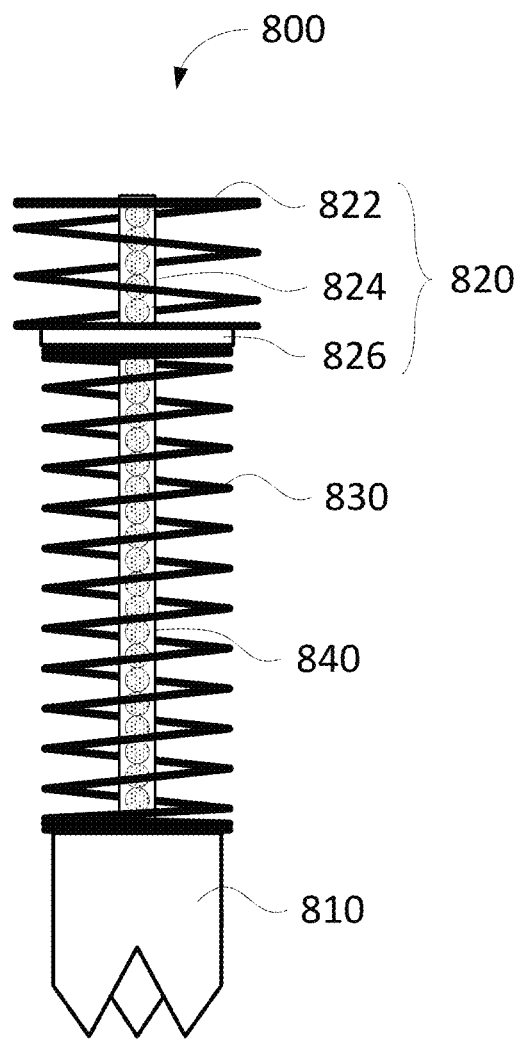

FIG. 8 illustrates yet another embodiment of a compressible contact pin 800 having an elastomeric connector. The compressible contact pin 800 includes a first contact element 810, a second contact element 820, a first compressible member 830, and a first deformable conductor 840. The first contact element 810 and the first compressible member 830 may perform the same or substantially similar function as the first contact element 610 and compressible member 630, respectively, described above with respect to FIG. 6.

For some embodiments, the first deformable conductor 840 may have the same or substantially similar features as the deformable conductor 640 or deformable conductor 740, described above with respect to FIGS. 6 and 7, respectively. That is, the first deformable conductor 840 may be an elastomeric connector, having one or more columns of conductive material, which electrically couples the first contact element 810 with the second contact element 820. For other embodiments, the first deformable conductor 840 may correspond to any conductive structure that is able maintain an electrical connection between the first contact element 810 and the second contact element 820 while under compression (such as a conductive wire).

As described above, the first deformable conductor 840 may be attached to the first and second contact elements 810 and 820 using any number of processes that are well known in the art. For example, the ends of the first deformable conductor 840 may be attached to the first and second contact elements 810 and 820, respectively, using an adhesive material. For some embodiments, the first deformable conductor 840 may be held in place by forces exerted between the first and second contact elements 810 and 820. For example, the forces holding the deformable conductor 840 in place may be provided by the tension in the first compressible member 830.

The second contact element 820 includes a second compressible member 822, a second deformable conductor 824, and a conductive plate 826. The conductive plate 826 attaches to the end of the first compressible member 830, and the second compressible member 822 and second deformable conductor 824 are attached to the other side of the conducive plate 826. More specifically, the conductive plate 826 may be of a conductive material (e.g., metal) to provide an electrical coupling between the first deformable conductor 840 and the second deformable conductor 824. For other embodiments, a diameter of the second compressible member 822 may be wider than the overall diameter of the first compressible member 830 (e.g., to maintain the contact pin 800 within a corresponding housing).

The second deformable conductor 824 may electrically couple to a contact pad of a testing apparatus, while the second compressible member 822 provides structural support for the second deformable conductor 824. For some embodiments, the second deformable conductor 824 may be an elastomeric connector (e.g., as described above with respect to FIGS. 6 and 7). For example, the second deformable conductor 824 may deform or stretch when brought into contact with the contact pad of a testing apparatus. This may ensure that the contact pin 800 establishes a secure (electrical) connection with the testing apparatus. For some embodiments, the second compressible member 822 may correspond to a spring or spring-like structure that provides additional compression strength (e.g., tension) to the second compressible member 824. For example, the second compressible member 822 may maintain a separation distance between the testing apparatus and the conductive plate 826, when the testing apparatus is in contact with the second deformable conductor 824, by opposing the compression force caused by the testing apparatus.

Figure 9:
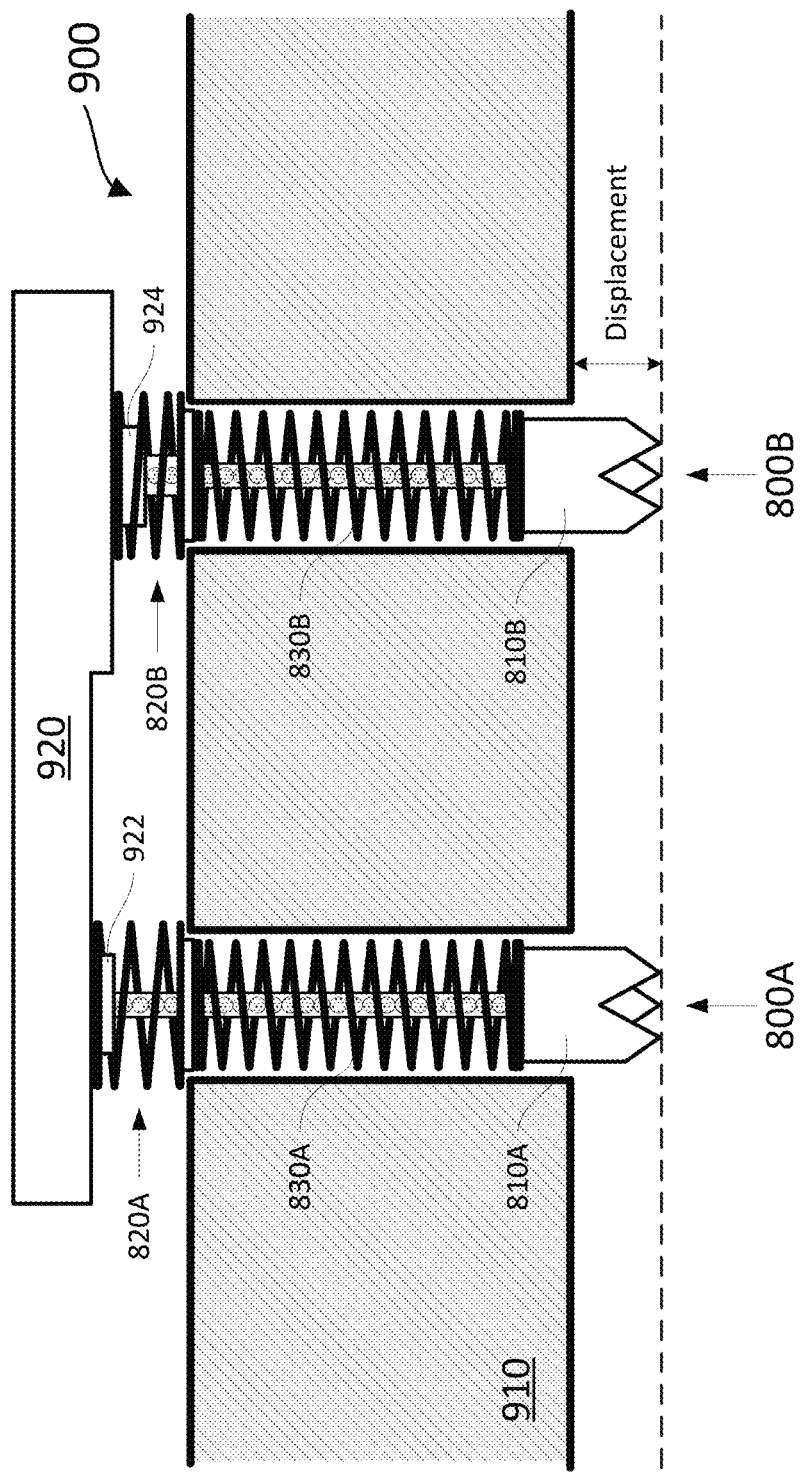
FIG. 9 illustrates an embodiment of a compressible contact pin assembly including a number of compressible contact pins such as depicted in FIG. 8.

The design of the second contact element 820 is particularly well-suited for applications involving an uneven distribution of compression forces across a number of contact pads. For example, FIG. 9 illustrates an embodiment of a compressible contact pin assembly 900 including a number of compressible contact pins such as depicted in FIG. 8. The contact pin assembly 900 includes a pair of contact pins 800A and 800B disposed within a housing assembly 910. Each of the contact pins 800A and 800B may be similar, if not identical, to the contact pin 800 of FIG. 8. The housing 910 holds the contact pins 800A and 800B in place when interfacing with a testing apparatus. For example, the top surface of the housing 910 may have an opening that is not wide enough for the second contact elements 820A and 820B of the contact pins 800A and 800B, respectively, to fit through. The housing 910 provides structural support for the contact pins 800A and 800B by guiding the movement or displacement of the first contact elements 810A and 810B, respectively.

FIG. 9 further depicts a testing apparatus 920 that is in contact with the second contact elements 820A and 820B of the respective contact pins 800A and 800B. As shown, the testing apparatus 920 has an uneven thickness (e.g., the right side of the testing apparatus 920 is thicker than the left side). The testing apparatus 920 also includes two contact pads 922 and 924 of unequal thickness (e.g., contact pad 924 protrudes further than contact pad 922). As a result, the right side of the testing apparatus 920 may exert a much greater downward force on contact element 820B than the left side of the testing apparatus 920 exerts on contact element 820A. However, because both contact elements 820A and 820B are compressible, the corresponding contact pins 800A and 800B may be "pre-loaded" against the testing apparatus 920. This allows both contact pins 800A and 800B to establish a secure connection with their respective contact pads 922 and 924, while maintaining substantially the same displacement through the other side of the housing. In other words, the forces exerted by the testing apparatus 920 have little or no bearing on the tension in the compressible members 830A and 830B (e.g., when the first contact elements 810A and 810B are brought into contact with corresponding contact bumps of an IC device). This may ensure that the first contact elements 810A and 810B are also able to establish a secure connection with respective contact bumps of an IC device.

FIGS. 10A and 10B illustrate an embodiment of a compressible contact pin 1000 including a number of conductive particles to provide electrical coupling. The compressible contact pin 1000 includes a first contact element 1010, a second contact element 1020, a compressible member 1030, and conductive particles 1040 coupled between the first contact element 1010 and the second contact element 1020. As described above, the shape or geometry of the first contact element 1010 may be designed to allow the first contact element 1010 to make contact with a contact pad or bump of an IC device. Further, the shape of the second contact element 1020 may be designed to allow the second contact element 1020 to make contact with the circuitry of a testing apparatus. For some embodiments, the base diameter of the second contact element 1020 is wider than the diameter of the compressible member 1030 (e.g., to hold the contact pin 1000 within a housing or support structure).

The compressible member 1030 maintains a separation distance between the contact elements 1010 and 1020 when the contact pin 1000 is in a natural or uncompressed state.

When placed in contact with an IC device and/or testing apparatus, the compressible member 1030 absorbs some of the force exerted on the contact elements 1010 and/or 1020. For some embodiments, the compressible member 1030 may be a spring or spring-like structure (e.g., having a number of coils) that compresses under external forces or pressure, and naturally reverts to an uncompressed state when no external force is applied. Further, for some embodiments, the compressible member 1030 may be formed from (or coated with) a non-conductive material that does not interfere with a flow of electrical signals between the first and second contact elements 1010 and 1020 (e.g., via the conductive particles 1040). In other embodiments, the compressible member 1030 may have a higher electrical impedance than that of the conductive particles 1040 to ensure that electrical signals communicated between the contact elements 1010 and 1020 travel only (or primarily) through the conductive particles 1040. The compressible member 1030 may be attached to each of the contact elements 1010 and 1020 using an adhesive material (e.g., glue). Alternatively, the ends of the compressible member 1030 may be welded or soldered to a respective base of each of the contact elements 1010 and 1020.

The conductive particles 1040 electrically couple the first contact element 1010 with the second contact element 1020 to facilitate a flow of electrical signals (or current) between the contact elements 1010 and 1020. The conductive particles 1040 may be formed from any conductive material (such as copper), and may be arranged in one or more columns to form an electrical connection between the first contact element 1010 to the second contact element 1020. More specifically, the conductive particles 1040 may be bounded by (e.g., disposed within) the compressible member 1030. The compressible member 1030 may hold the conductive particles 1040 in place, for example, to enable the conductive particles 1040 to maintain an electrical connection between the first contact element 1010 and the second contact element 1020 when the contact pin 1000 is compressed. For example, vertical movement of the conductive particles 1040 may be restricted by tension in the compressible member 1030 (e.g., when the contact pin 1000 is in a compressed and/or uncompressed state), while lateral movement of the conductive particles 1040 may be restricted by the circumference or diameter of the individual coils that form the compressible member 1030.

The conductive particles 1040 may be configured to press against and/or compress with one another (e.g., to maintain the electrical connection between the contact elements 1010 and 1020) when the contact pin 1000 is compressed. As shown in FIG. 10B, the compressible member 1030 may bend when one or more external forces are applied between the contact elements 1010 and 1020 (e.g., when the contact pin 1000 is under compression). More specifically, the compressible member 1030 may compress in the direction of the external forces, and may bend in a direction perpendicular to the direction in which it compresses. For some embodiments, the conductive particles 1040 may shift and/or rotate (e.g., relative to other conductive particles 1040), to maintain the electrical connection between the contact elements 1010 and 1020, when the compressible member 1030 compresses and/or bends. The compressible member 1030 may "guide" the movement of the conductive particles 1040 to ensure that each of the conductive particles 1040 remains in contact with at least one other conductive particle 1040, and/or one of the contact elements 1010 or 1020, while the contact pin 1000 is under compression.

The size, shape, and/or number of individual conductive particles 1040 may be configured to allow the conductive particles 1040 to shift and/or rotate when the contact pin 1000 is compressed. For example, the diameter or width of each conductive particle 1040 may be larger than a maximum "pitch" of the compressible member 1030 (e.g., spacing between the coils) to keep the conductive particles 1040 bounded when the compressible member 1030 compresses and/or bends. Further, the diameter or width of each conductive particle 1040 may be less than a width of the compressible member 1030 (e.g., such that there exists a gap between each conductive particle 1040 and the edges or coils of the compressible member 1030) to allow for some lateral movement of the conductive particles 1040. For some embodiments, the gap may be smaller than the diameter or width of the conductive particles 1040 (e.g., the width of each conductive particle 1040 may be greater than half the width of the compressible member 1030) to ensure that the conductive particles 1040 remain in a substantially vertical configuration, and thus maintain an electrical connection between the contact elements 1010 and 1020, when the compressible member 1030 bends and/or compresses.

It is noted that the contact pin 1000 of FIGS. 10A and 10B may be substantially similar to the contact pin 600 of FIG. 6, without the elastic shield 644. Aspects of the present disclosure recognize that the elastic shield 644 may not be suitable for very fine pitch applications (such as testing devices with very small contact pads and/or bumps). For example, the elastic shield 644 adds to the thickness of the deformable conductor 640 and thereby limits the size (e.g., width or diameter) of the compressible member 630. By excluding the elastic shield 644 of FIG. 6, the contact pin 1000 relies on the compressible member 1030 to retain (and align) the conductive particles 1040 between the contact elements 1010 and 1020, and thus allows the compressible member 1030 to be more closely fitted to the conductive particles 1040. Accordingly, the contact pin 1000 may have a smaller form factor than the contact pin 600 of FIG. 6, while still maintaining an electrical coupling of the contact elements 1010 and 1020 via the conductive particles 1040.

Among other advantages, the conductive particles 1040 may provide a consistent electrical connection between the contact elements 1010 and 1020 when the contact pin 1000 is in a compressed and/or uncompressed state. Because the conductive particles 1040 may rotate and/or shift relative to one another, the alignment of the conductive particles 1040 may dynamically adjust to conform to the shape of the compressible member 1030 (e.g., such as the bending depicted in FIG. 10B). The contact pin 1000 of FIGS. 10A and 10B may be particularly advantageous for very small contact pin implementations. For example, with reference to FIGS. 2A and 2B, the deformable conductor 240 (e.g., conductive wire) may break if the compressible member 230 bends more than a threshold degree, thus severing the electrical connection between the contact elements 210 and 220. In contrast, by having a number of conductive particles 1040 form the electrical connection between the contact elements 1010 and 1020 (e.g., in lieu of one contiguous wire), the contact pin 1000 may compress and/or bend without severing the connection between the first contact element 1010 and the second contact element 1020.

Figure 11A:
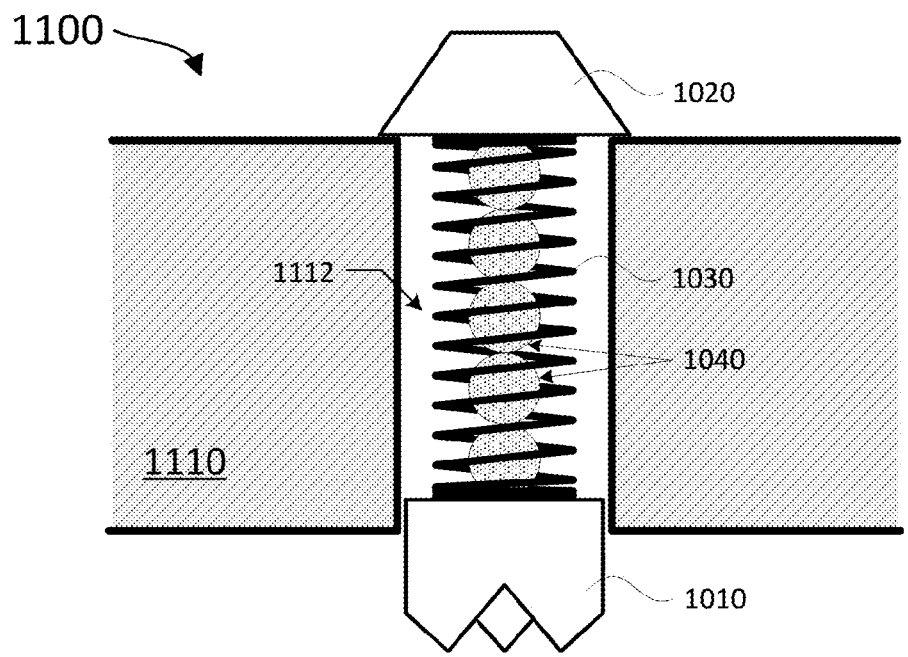
FIGS. 11A and 11B illustrate an embodiment of a compressible contact pin assembly including a compressible contact pin such as depicted in FIGS. 10A and 10B.
Figure 11B:
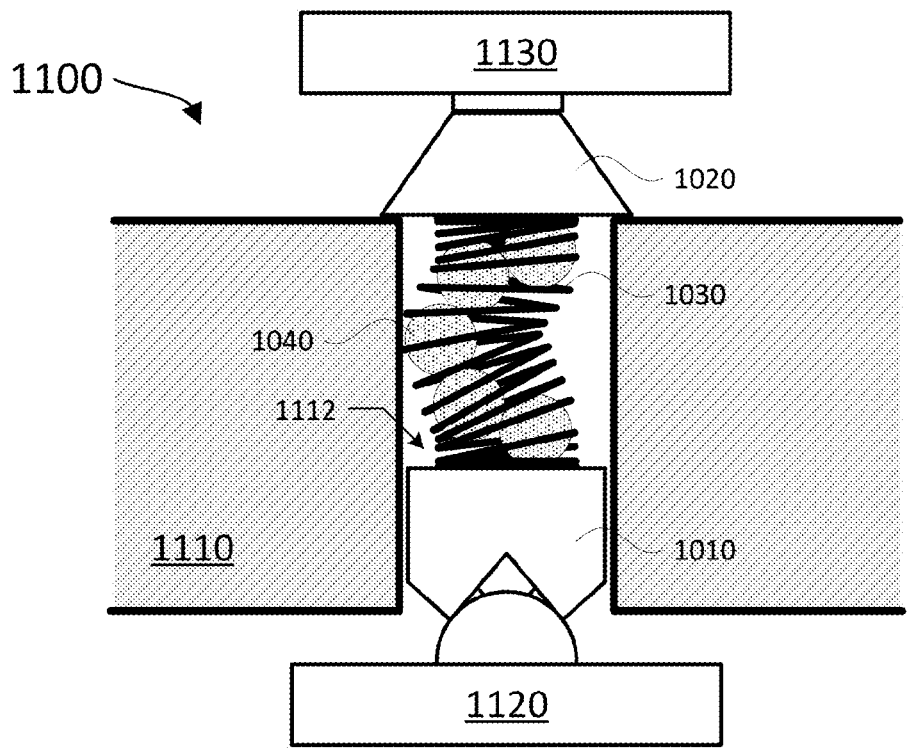

FIGS. 11A and 11B illustrate an embodiment of a compressible contact pin assembly 1100 including a compressible contact pin 1000 such as depicted in FIGS. 10A and 10B. More specifically, FIG. 11A depicts the contact pin assembly 1100 in an uncompressed state, whereas FIG. 11B depicts the contact pin assembly 1100 in a compressed state.

The contact pin assembly 1100 includes a first contact element 1010, a second contact element 1020, a compressible member 1030, a number of conductive particles 1040, and a housing 1110. The contact elements 1010 and 1020, compressible member 1030, and conductive particles 1040 collectively form the compressible contact pin 1000 described above with respect to FIGS. 10A and 10B.

The housing 1110 may be used to hold the contact pin 1000 in place when interfacing a testing apparatus with an IC device. In some embodiments, the housing 1110 may be formed from a non-conductive/dielectric material. As shown in FIG. 11A, at least a portion of the contact pin 1000 (such as the compressible member 1030, conductive particles 1040, and/or first contact element 1010) may be disposed, at least in part, within a hole or opening 1112 in the housing 1110. For some embodiments, the diameter or width of the hole 1112 may be smaller than the diameter or width of the base of the second contact element 1020. For example, the base of the second contact element 1020 may include an extended lip to hold the contact pin 1000 within the housing 1110. On the other hand, the diameter or width of the compressible member 1030 and the first contact element 1010 may be smaller than the diameter or width of the hole 1112 to allow the contact pin 1000 to compress and/or bend inside the hole 1112 of the housing 1110. Accordingly, the first contact element 1010, compressible member 1030, and conductive particles 1040 may be suspended from the contact element 1020 within the hole 1112 of the housing 1110.

The housing 1110 may further provide structural support for the contact pin 1000 by guiding the movement or displacement of the contact elements 1010 and 1020. For some embodiments, the housing 1110 may also limit an amount of bending in the compressible member 1030 when the contact pin 1000 is compressed. For example, as shown in FIG. 11B, the second contact element 1020 may make contact with a testing apparatus 1130 and the first contact element 1010 may make contact with a contact bump of an IC device 1120 under test. The testing apparatus 1130 and IC device 1120 exert external forces in a direction along the length of the contact pin 1000. This may cause the compressible member 1030 to compress (e.g., in the direction of the external forces) and bend (e.g., in a direction perpendicular to the external forces). Aspects of the present disclosure recognize that, the wider the hole 1112, the more room the compressible member 1030 has to bend. Thus, in some aspects, the width or diameter of the hole 1112 may be configured to limit the amount of bending by the compressible member 1030 so that the spacing between its coils does not exceed a maximum allowable pitch. For example, the maximum allowable pitch may be smaller than the diameter or width of the conductive particles 1040 (e.g., to prevent the conductive particles 1040 from escaping the compressible member 1030).

As one or more external forces are applied to the contact elements 1010 and 1020, the conductive particles 1040 may also shift and/or rotate to accommodate and/or conform to the compression and bending of the compressible member 1030. For some embodiments, the conductive particles 1040 may be configured to shift and/or rotate while remaining in contact with at least one other conductive particle 1040 and/or one of the contact elements 1010 or 1020. Accordingly, the conductive particles 1040 may facilitate the transmission of electrical signals between the testing apparatus 1130 and the IC device 1120 with little or no wear and tear on the surfaces of the contact elements 1010 and 1020 and/or the conductive particles 1040.

FIGS. 12A and 12B illustrate another embodiment of a compressible contact pin 1200 including a number of conductive particles to provide electrical coupling. The compressible contact pin 1200 includes a compressible member 1230 and conductive particles 1210(a)-1210(d) coupled between the ends of the compressible member 1230. It is noted that the contact pin 1200 may be substantially similar to the contact pin 1000 of FIGS. 10A and 10B, without the contact elements 1010 and 1020 coupled to the ends of the compressible member 1030. In some embodiments, one of the conductive particles 1210(d) may be affixed (e.g., welded, soldered, or bonded) to a base of the compressible member 1230 and another one of the conductive particles 1210(d) may be similarly affixed to the other base of the compressible member 1230. In some aspects, at least a portion of the conductive particle 1210(d) may extend beyond the lower end of the compressible member 1230, for example, to make contact with a contact pad or bump of an IC device. Similarly, at least a portion of the conductive particle 1210(a) may extend beyond the upper end of the compressible member 1230, for example, to make contact with the circuitry of a testing apparatus. In this manner, the conductive particles 1210(d) and 1210(a) may perform the same (or at least substantially similar) functions as the contact elements 1010 and 1020 described above with respect to FIGS. 10A and 10B.

The compressible member 1230 maintains a separation distance between the conductive particles 1210(a) and 1210(d) (e.g., corresponding to the upper and lower ends of the compressible member 1230) when the contact pin 1200 is in a natural or uncompressed state. When placed in contact with an IC device and/or testing apparatus, the compressible member 1230 absorbs some of the force exerted on the conductive particles 1210(a)-1210(d). For some embodiments, the compressible member 1230 may be a spring or spring-like structure (e.g., having a number of coils) that compress under external forces or pressure, and naturally reverts to an uncompressed state when no external force is applied. Further, for some embodiments, the compressible member 1230 may be formed from (or coated with) a non-conductive material that does not interfere with a flow of electrical signals between the conductive particles 1210(a)-1210(d). In other embodiments, the compressible member 1230 may have a higher electrical impedance than that of the conductive particles 1210(a)-1210(d) to ensure that electrical signals communicated between the conductive particles 1210(a) and 1210(d) travel only (or primarily) through the conductive particles 1210(a)-1210(d).

The conductive particles 1210(a)-1210(d) may facilitate a flow of electrical signals (or current) between the ends of the compressible member 1230. The conductive particles 1210(a)-1210(d) may be formed from any conductive material (such as copper), and may be arranged in one or more columns to form an electrical connection along the length of the compressible member 1230. More specifically, the conductive particles 1210(a)-1210(d) may be bounded by (e.g., disposed at least in part within) the compressible member 1230. The compressible member 1230 may hold the conductive particles 1210(a)-1210(d) in place, for example, to enable the conductive particles 1210(a)-1210(d) to maintain an electrical connection between the ends of the compressible member 1230 when the contact pin 1200 is compressed. For example, vertical movement of the conductive particles 1210(a)-1210(d) may be restricted by tension in the compressible member 1230 (e.g., when the contact pin 1200 is in a compressed and/or uncompressed state), while lateral movement of the conductive particles 1210(a)-1210(d) may be restricted by the circumference or diameter of the individual coils that form the compressible member 1230.

The conductive particles 1210(a)-1210(d) may be configured to press against and/or compress with one another (e.g., to maintain the electrical connection between across the length of the compressible member 1230) when the contact pin 1200 is compressed. As shown in FIG. 12B, the compressible member 1230 may bend when one or more external forces are applied between the conductive particles 1210(a) and 1210(d) (e.g., or between the ends of the compressible member 1230). More specifically, the compressible member 1230 may compress in the direction of the external forces, and may bend in a direction perpendicular to the direction in which it compresses. For some embodiments, the conductive particles 1210(a)-1210(d) may shift and/or rotate (e.g., relative to other conductive particles 1210(a)-1210(d)), to maintain the electrical connection across the length of the compressible member 1230, when the compressible member 1230 compresses and/or bends. The compressible member 1230 may "guide" the movement of the conductive particles 1210(a)-1210(d) to ensure that each of the conductive particles 1210(a)-1210(d) remains in contact with at least one other conductive particle while the contact pin 1200 is under compression.

The size, shape, and/or number of individual conductive particles 1210(a)-1210(d) may be configured to allow the conductive particles 1210(a)-1210(d) to shift and/or rotate when the contact pin 1200 is compressed. In the example of FIGS. 12A and 12B, the conductive particles 1210(a)-1210(d) are shown as round or cylindrical "sticks" (e.g., rather the spherical "ball" configuration of the conductive particles 1040 depicted in FIGS. 10A and 10B). However, the conductive particles 1210(a)-1210(d) may be configured in various other shapes and/or sizes without deviating from the embodiments of the present disclosure. For example, the diameter or width of each of each of the conductive particles 1210(a)-1210(d) may be larger than a maximum pitch of the compressible member 1230 (e.g., spacing between the coils) to keep the conductive particles 1210(a)-1210(d) bounded when the compressible member 1230 compresses and/or bends. Further, the diameter or width of each of the conductive particles 1210(a)-1210(d) may be less than a width of the compressible member 1230 (e.g., such that there exists a gap between each of the conductive particles 1210(a)-1210(d) and the edges or coils of the compressible member 1230) to allow for some lateral movement of the conductive particles 1210(a)-1210(d). For some embodiments, the gap may be smaller than the diameter or width of the conductive particles 1210(a)-1210(d) (e.g., the width of each of the conductive particles 1210(a)-1210(d) may be greater than half the width of the compressible member 1230) to ensure that the conductive particles 1210(a)-1210(d) remain in a substantially vertical configuration, and thus maintain an electrical connection along the length of compressible member 1230, when the compressible member 1230 bends and/or compresses.

Figure 13A:
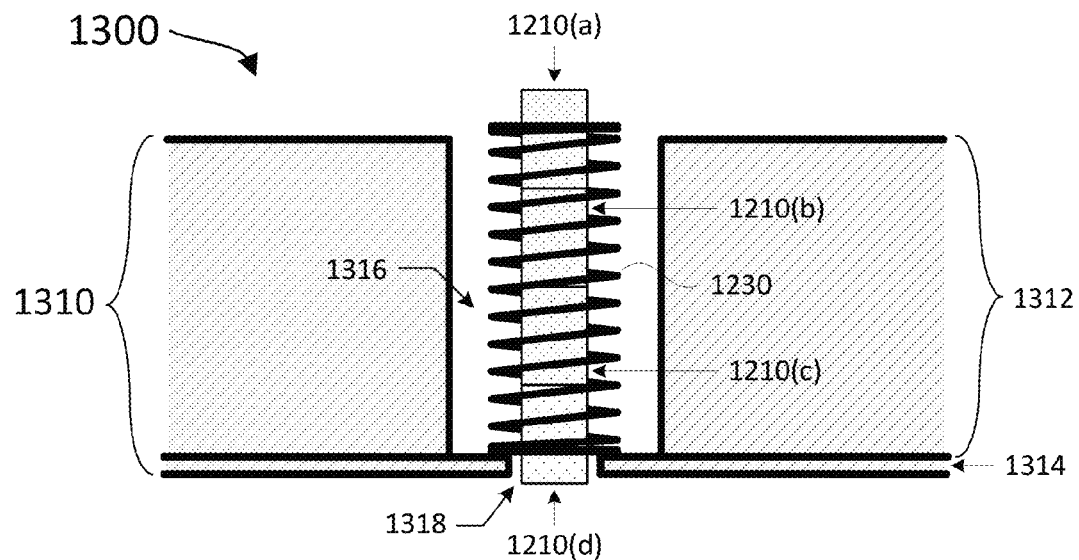
FIGS. 13A and 13B illustrate another embodiment of a compressible contact pin assembly including a compressible contact pin such as depicted in FIGS. 12A and 12B.
Figure 13B:
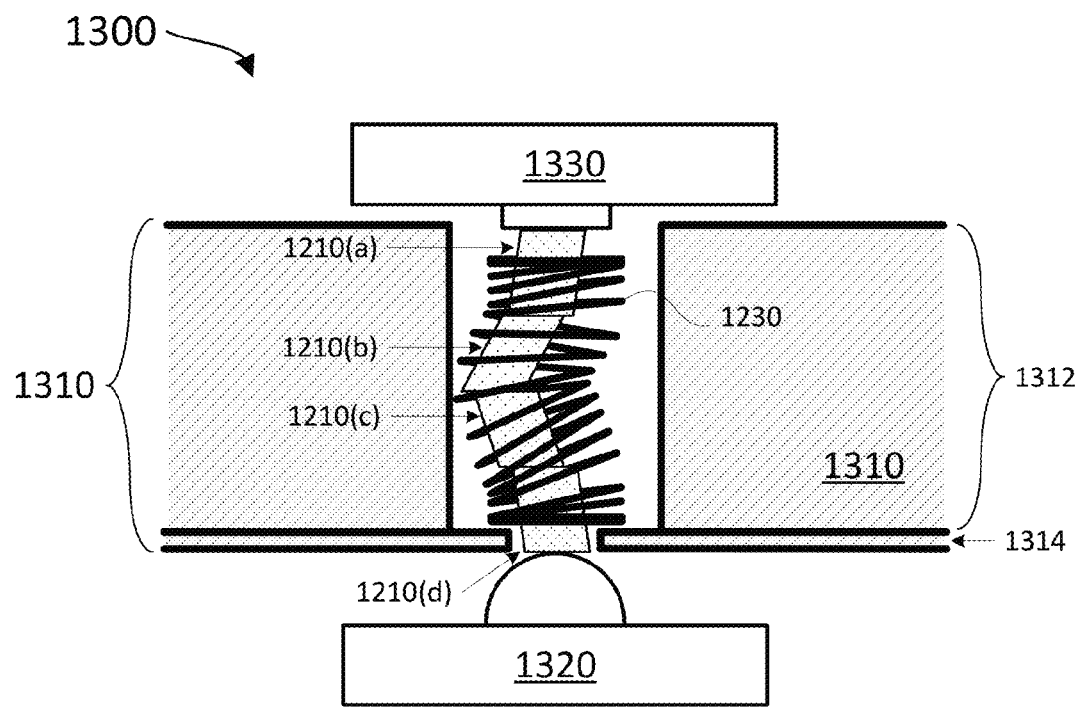

FIGS. 13A and 13B illustrate another embodiment of a compressible contact pin assembly 1300 including a compressible contact pin such as depicted in FIGS. 12A and 12B. More specifically, FIG. 13A depicts the contact pin assembly 1300 in an uncompressed state, whereas FIG. 13B depicts the contact pin assembly 1300 in a compressed state. The contact pin assembly 1300 includes a compressible member 1230, a number of conductive particles 1210(a)-1210(d), and a housing 1310. The compressible member 1230 and conductive particles 1210(a)-1210(d) collectively form the compressible contact pin 1200 described above with respect to FIGS. 12A and 12B.

The housing 1310 may be used to hold the contact pin 1200 in place when interfacing a testing apparatus with an IC device. In some embodiments, the housing 1310 may be formed from a non-conductive (e.g., dielectric or ceramic) material. In the example shown in FIGS. 13A and 13B, the housing 1310 may be formed by a combination of two or more ceramic "plates" 1312 and 1314. However, in other implementations, the housing 1310 may be of a unibody construction (not shown for simplicity). As shown in FIG. 12A, at least a portion of the contact pin 1200 (such as the compressible member 1230 and conductive particles 1210(a)-1210(d)) may be disposed, at least in part, within a first hole or opening 1316 in the housing 1310 (e.g., in the upper ceramic plate 1312). For some embodiments, the diameter or width of the first hole 1316 may be larger than the diameter or width of the compressible member 1230 to allow the contact pin 1200 to compress and/or bend inside the housing 1310.

Furthermore, at least a portion of the contact pin 1200 (e.g., such as the conductive particle 1210(d)) may be seated within a second hole or opening 1318 in the housing 1310 (e.g., in the lower ceramic plate 1314). For some embodiments, the diameter or width of the second hole 1318 may be smaller than the diameter or width of the compressible member 1230, but larger than the diameter or width of the conductive particles 1210(a)-1210(d), to hold the compressible member within the housing 1310 while allowing the conductive particle 1210(d) to make contact with a device under test. Accordingly, the conductive particles 1210(a)-1210(d) may be suspended by the compressible member 1230 within the holes 1316 and 1318 of the housing 1310.

The housing 1310 may further provide structural support for the contact pin 1200 by guiding the movement or displacement of the conductive particles 1210(a)-1210(d). For some embodiments, the housing 1310 may also limit an amount of bending the compressible member 1230 when the contact pin 1200 is compressed. For example, as shown in FIG. 13B, the conductive particle 1210(a) may make contact with a testing apparatus 1330 and the conductive particle 1210(d) may make contact with a contact bump of an IC device 1320 under test. The testing apparatus 1330 and IC device 1320 exert external forces in a direction along the length of the contact pin 1200. This may cause the compressible member 1230 to compress (e.g., in the direction of the external forces) and bend (e.g., in a direction perpendicular to the external forces). Aspects of the present disclosure recognize that, the wider the hole 1316, the more room the compressible member 1230 has to bend. Thus, in some aspects, the width or diameter of the hole 1316 may be configured to limit the amount of bending by the compressible member 1230 so that the spacing between its coils does not exceed a maximum allowable pitch. For example, the maximum allowable pitch may be smaller than the diameter or width of the conductive particles 1210(a)-1210(d) (e.g., to prevent the conductive particles 1210(a)-1210(d) from escaping the compressible member 1230).

As one or more external forces are applied to the contact pin 1200, the conductive particles 1210(a)-1210(d) may also shift and/or rotate to accommodate and/or conform to the compression and bending of the compressible member 1230. For some embodiments, the conductive particles 1210(a)-1210(d) may be configured to shift and/or rotate while remaining in contact with at least one of the other conductive particles 1210(a)-1210(d). Accordingly, the conductive particles 1210(*a*)-1210(*d*) may facilitate the transmission of electrical signals between the testing apparatus 1330 and the IC device 1320 with little or no wear and tear on the surfaces of the contact pin 1200.

Figure 14:
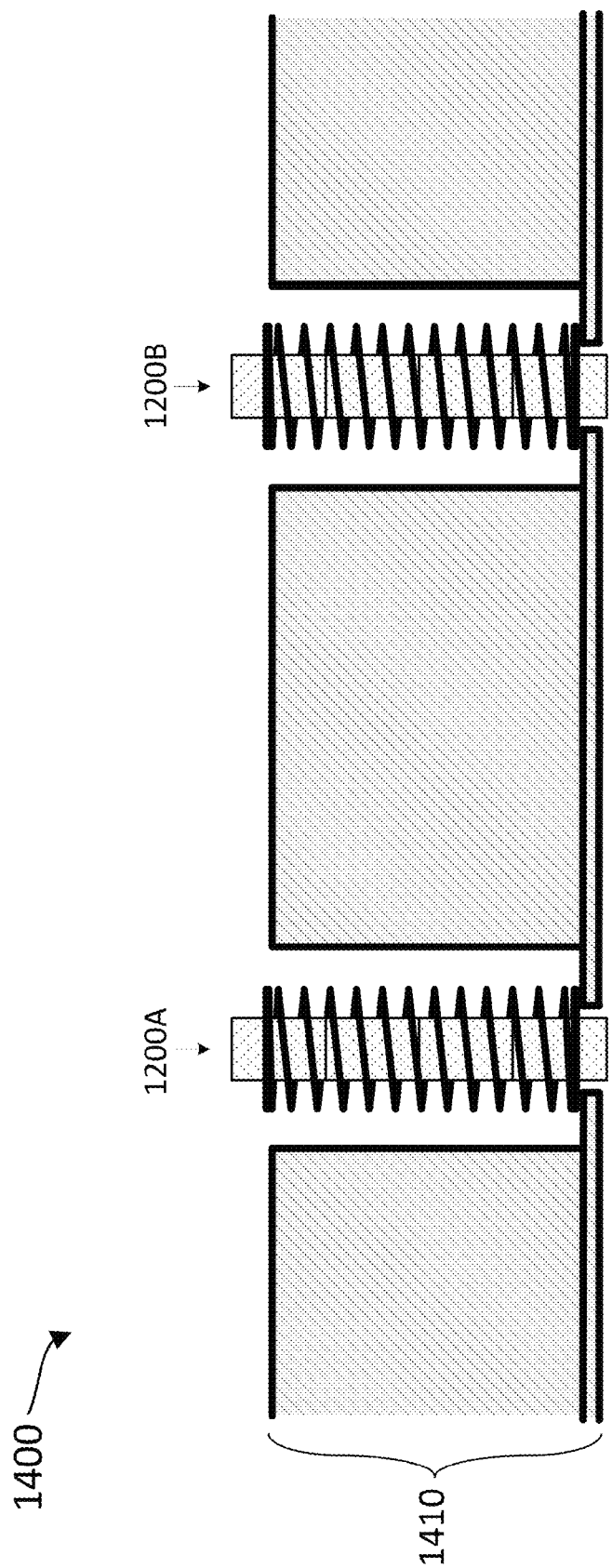
FIG. 14 illustrates an embodiment of a compressible contact pin assembly including a number of compressible contact pins such as depicted in FIGS. 12A and 12B.

For some embodiments, the housing 1310 may be configured to hold multiple compressible contact pins similar to the compressible contact pin 1200 of FIGS. 12A and 12B. For example, FIG. 14 illustrates an embodiment of a compressible contact pin assembly 1400 including a housing 1410 holding at least two compressible contact pins 1200A and 1200B. Each of the compressible contact pins 1200A and 1200B may be an embodiment of the compressible contact pin 1200 described above with respect to FIGS. 12A and 12B. For example, each of the compressible contact pins 1200A and 1200B may include a compressible member (such as compressible member 1230) and a number of conductive particles (such as conductive particles 1210(*a*)-1210(*d*)) configured to shift and/or rotate when the compressible member compresses or bends to maintain an electrical coupling between the ends of the contact pins 1200A and 1200B. Although only two contact pins 1200A and 1200B are shown for simplicity, the compressible contact pin assembly 1400 may include fewer or more contact pins than those shown in FIG. 14. For some embodiments, the compressible contact pin assembly 1400 may correspond to the probe head of a probe card used for testing IC devices.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A contact pin, comprising:
   a compressible member configured to compress when one or more external forces are applied between a first end of the compressible member and a second end of the compressible member, and to maintain a separation distance between the first end of the compressible member and the second end of the compressible member when no external forces are applied, wherein the compressible member is further configured to bend when the one or more external forces are applied between the first end and the second end of the compressible member; and
   a plurality of conductive particles bounded at least in part by the compressible member to form an electrical connection between the first end of the compressible member and the second end of the compressible member, the plurality of conductive particles being configured to compress with one another when the compressible member is compressed, and wherein at least one of the plurality of conductive particles is configured to rotate or shift relative to others of the plurality of conductive particles when the compressible member bends.

2. The contact pin of claim 1, wherein a first conductive particle of the plurality of conductive particles is affixed to the first end of the compressible member, and wherein a second conductive particle of the plurality of conductive particles is affixed to the second end of the compressible member.

3. The contact pin of claim 1, wherein the compressible member comprises a spring having a plurality of coils.

4. The contact pin of claim 2, wherein a diameter or width of each of the plurality of conductive particles is greater than a maximum pitch of the spring.

5. The contact pin of claim 2, wherein at least some of the plurality of conductive particles are held between the first end of the compressible member and the second end of the compressible member, at least in part, by the plurality of coils.

6. The contact pin of claim 1, wherein the plurality of conductive particles is configured to maintain the electrical connection between the first end of the compressible member and the second end of the compressible member when the compressible member bends.

7. The contact pin of claim 1, wherein an impedance of the compressible member is greater than an impedance of the plurality of conductive particles.

8. A contact pin assembly, comprising:
   a compressible member configured to compress when one or more external forces are applied between a first end of the compressible member and a second end of the compressible member, and to maintain a separation distance between the first end of the compressible member and the second end of the compressible member when no external forces are applied, wherein the compressible member is further configured to bend when the one or more external forces are applied between the first and second end of the compressible member;
   a plurality of conductive particles bounded at least in part by the compressible member to form an electrical connection between the first end of the compressible member and the second end of the compressible member, the plurality of conductive particles being configured to compress with one another when the compressible member is compressed, and wherein at least one of the plurality of conductive particles is configured to rotate or shift relative to others of the plurality of conductive particles when the compressible member bends; and
   a housing including one or more holes, wherein a diameter or width of each of the one or more holes is configured to hold the compressible member while limiting an amount of bending by the compressible member when the one or more external forces are applied between the first end of the compressible member and the second end of the compressible member.

9. The contact pin assembly of claim 8, wherein a first conductive particle of the plurality of conductive particles is affixed to the first end of the compressible member, and wherein a second conductive particle of the plurality of conductive particles is affixed to the second end of the compressible member.

10. The contact pin assembly of claim 8, wherein the compressible member comprises a spring having a plurality of coils.

11. The contact pin assembly of claim 10, wherein a diameter or width of each of the plurality of conductive particles is greater than a maximum pitch of the spring.

12. The contact pin assembly of claim 10, wherein at least some of the plurality of conductive particles are held between the first end of the compressible member and the second end of the compressible member, at least in part, by the plurality of coils.

13. The contact pin assembly of claim 8, wherein the plurality of conductive particles is configured to maintain the electrical connection between the first end of the compressible member and the second end of the compressible member when the compressible member bends.

14. The contact pin assembly of claim 8, wherein an impedance of the compressible member is greater than an impedance of the plurality of conductive particles.

* * * * *